United States Patent
Ahn

(10) Patent No.: US 10,319,791 B2
(45) Date of Patent: Jun. 11, 2019

(54) METHOD OF MANUFACTURING DISPLAY DEVICE

(71) Applicant: Samsung Display Co., Ltd., Yongin-si, Gyeonggi-do (KR)

(72) Inventor: Hyeong-Cheol Ahn, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 20 days.

(21) Appl. No.: 15/186,782

(22) Filed: Jun. 20, 2016

(65) Prior Publication Data

US 2016/0300890 A1   Oct. 13, 2016

Related U.S. Application Data

(62) Division of application No. 13/908,283, filed on Jun. 3, 2013, now abandoned.

(30) Foreign Application Priority Data

Feb. 28, 2013   (KR) .................. 10-2013-0022442

(51) Int. Cl.
| | |
|---|---|
| *H01L 27/32* | (2006.01) |
| *G06F 1/16* | (2006.01) |
| *G06F 3/046* | (2006.01) |
| *G06F 3/041* | (2006.01) |
| *H01L 51/56* | (2006.01) |
| *H01L 27/12* | (2006.01) |

(52) U.S. Cl.
CPC .......... *H01L 27/323* (2013.01); *G06F 1/1626* (2013.01); *G06F 1/1643* (2013.01); *G06F 1/1656* (2013.01); *G06F 3/046* (2013.01); *G06F 3/0412* (2013.01); *H01L 27/3262* (2013.01); *H01L 51/56* (2013.01); *G06F 2203/04103* (2013.01); *G06F 2203/04107* (2013.01); *H01L 27/1274* (2013.01); *H01L 2227/323* (2013.01); *H01L 2251/5338* (2013.01); *Y10T 29/49117* (2015.01)

(58) Field of Classification Search
CPC ..... H01L 27/323; H01L 51/56; G06F 1/1626; G06F 1/1643; G06F 3/0412
See application file for complete search history.

(56) References Cited

U.S. PATENT DOCUMENTS

| | | | |
|---|---|---|---|
| 2004/0114062 A1* | 6/2004 | Nishio | .............. G02F 1/133308 349/58 |
| 2004/0125312 A1* | 7/2004 | You | ..................... G02F 1/13338 349/149 |
| 2006/0066581 A1 | 3/2006 | Lyon et al. | |
| 2006/0238494 A1 | 10/2006 | Narayanaswami et al. | |
| 2008/0180399 A1 | 7/2008 | Cheng | |
| 2008/0266273 A1 | 10/2008 | Slobodin et al. | |

(Continued)

FOREIGN PATENT DOCUMENTS

| | | |
|---|---|---|
| KR | 10-2006-0114809 | 11/2006 |
| KR | 10-2011-0135672 | 12/2011 |

*Primary Examiner* — Towfiq Elahi
(74) *Attorney, Agent, or Firm* — Lewis Roca Rothgerber Christie LLP

(57) ABSTRACT

A method of manufacturing a display device is provided. The display device includes a digitizer which is formed so that at least a part thereof is bent and a display panel which is installed along a shape of an outer surface of the digitizer.

6 Claims, 6 Drawing Sheets

(56) References Cited

U.S. PATENT DOCUMENTS

| | | | |
|---|---|---|---|
| 2009/0284904 A1* | 11/2009 | Wu | G02F 1/133305 |
| | | | 361/679.01 |
| 2010/0116155 A1* | 5/2010 | Yoshida | G02F 1/1303 |
| | | | 100/35 |
| 2010/0208494 A1 | 8/2010 | Kuo et al. | |
| 2010/0253902 A1* | 10/2010 | Yamazaki | G02F 1/1303 |
| | | | 349/158 |
| 2011/0227822 A1 | 9/2011 | Shai | |
| 2012/0105092 A1* | 5/2012 | Abiru | G01M 99/008 |
| | | | 324/760.01 |
| 2012/0320541 A1* | 12/2012 | Chen | G09F 9/33 |
| | | | 361/749 |

* cited by examiner

METHOD OF MANUFACTURING DISPLAY DEVICE

CROSS-REFERENCE TO RELATED APPLICATIONS

This application is a divisional of U.S. patent application Ser. No. 13/908,283, filed on Jun. 3, 2013, which claims the benefit of Korean Patent Application No. 10-2013-0022442, filed on Feb. 28, 2013, in the Korean Intellectual Property Office, the disclosures of which are incorporated herein in their entireties by reference.

BACKGROUND

Field

The present invention relates to a display device and a method of manufacturing the same.

Description of the Related Technology

Electronic devices based on mobility have been widely used. Besides small electronic devices such as mobile phones, tablets have been widely used as mobile electronic devices.

Such a mobile electronic device includes a display panel to provide visual information, such as an image, to a user in order to support various functions. As other parts for driving the display panel are made small, the display panel has gradually occupied a large part of an electronic device. A structure which is bendable, to have a predetermined angle in a flat state, has been developed.

The display panel may be installed in various shapes in the electronic device. The display panel may be installed in a bent state in the electronic device. For example, the display panel may be installed on a curved surface such as a pillar of a building or the like or may be installed in a bent state when being used for a design of the electronic device. Various types of members may be used to keep a shape of the display panel. The design of the electronic device may be limited or a size of the electronic device may be increased due to using the members. In other words, unnecessary effort may be additionally done.

SUMMARY OF CERTAIN INVENTIVE ASPECTS

Embodiments of the present invention provide a display device which is simply manufactured and a method of manufacturing the same.

According to an aspect of the present invention, there is provided a display device including: a digitizer formed with at least a part thereof bent; and a display panel installed to correspond to a shape of the digitizer.

The display device may further include an adhesive layer disposed between the digitizer and the display panel to adhere the digitizer and the display panel to each other.

The digitizer may include: a first digitizer on which first lines are formed; and a second digitizer on which second lines are formed to intersect with the first lines at a predetermined angle.

The display device may further include an electromagnetic interference (EMI) shielding layer bent and adhered to the digitizer.

The display device may further include a flexible printed circuit (FPC) bent and adhered to the EMI shielding layer.

The digitizer may be plastically deformed when bent.

The display panel may be flexible.

According to another aspect of the present invention, there is provided a method of manufacturing a display device, including: manufacturing and providing a display panel and a digitizer; and bending at least a part of the digitizer through a jig.

The method may further include: adhering the display panel onto an outer surface of the digitizer to keep a bent state of the display panel.

Before at least a part of the digitizer is bent through the jig, the display panel may be adhered to the digitizer, and then the at least a part of the digitizer and at least a part of the display panel may be simultaneously bent through the jig.

The method may further include: adhering the display panel and the digitizer to each other through an adhesive layer.

The method may further include: adhering an EMI shielding layer to the digitizer before the at least a part of the digitizer is bent through the jig.

The method may further include: adhering a flexible printed circuit (FPC) to the EMI shielding layer.

The display panel may be flexible.

The digitizer may include: a first digitizer on which first lines are formed; and a second digitizer on which second lines are formed to intersect with the first lines.

BRIEF DESCRIPTION OF THE DRAWINGS

The above and other features and advantages of the present invention will become more apparent by describing in detail certain embodiments thereof with reference to the attached drawings in which.

DETAILED DESCRIPTION OF CERTAIN INVENTIVE EMBODIMENTS

The present invention will now be described more fully with reference to the accompanying drawings, in which certain embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. The terminology used herein is for the purpose of describing particular embodiments only and is not intended to be limiting of example embodiments. As used herein, the singular forms "a", "an", and "the" are intended to include the plural forms as well, unless the context clearly indicates otherwise. It will be further understood that the terms "comprises", "comprising", "includes" and/or "including," when used herein, specify the presence of stated features, integers, steps, operations, elements, and/or components, but do not preclude the presence or addition of one or more other features, integers, steps, operations, elements, components, and/or groups thereof. It will be understood that, although the terms 'first', 'second', 'third', etc. may be used herein to describe various elements, components, regions, layers and/or sections, these elements, components, regions, layers and/or sections should not be limited by these terms. These terms are only used to distinguish one element, component, region, layer or section from another region, layer or section.

Figure 1:
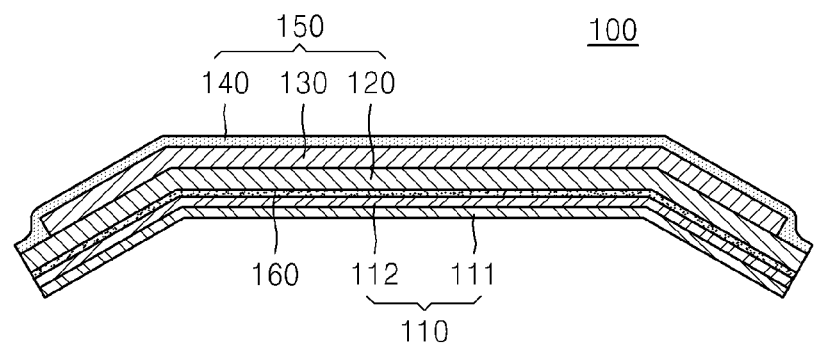
FIG. 1 is a view illustrating a display device according to an embodiment of the present invention.
Figure 1:
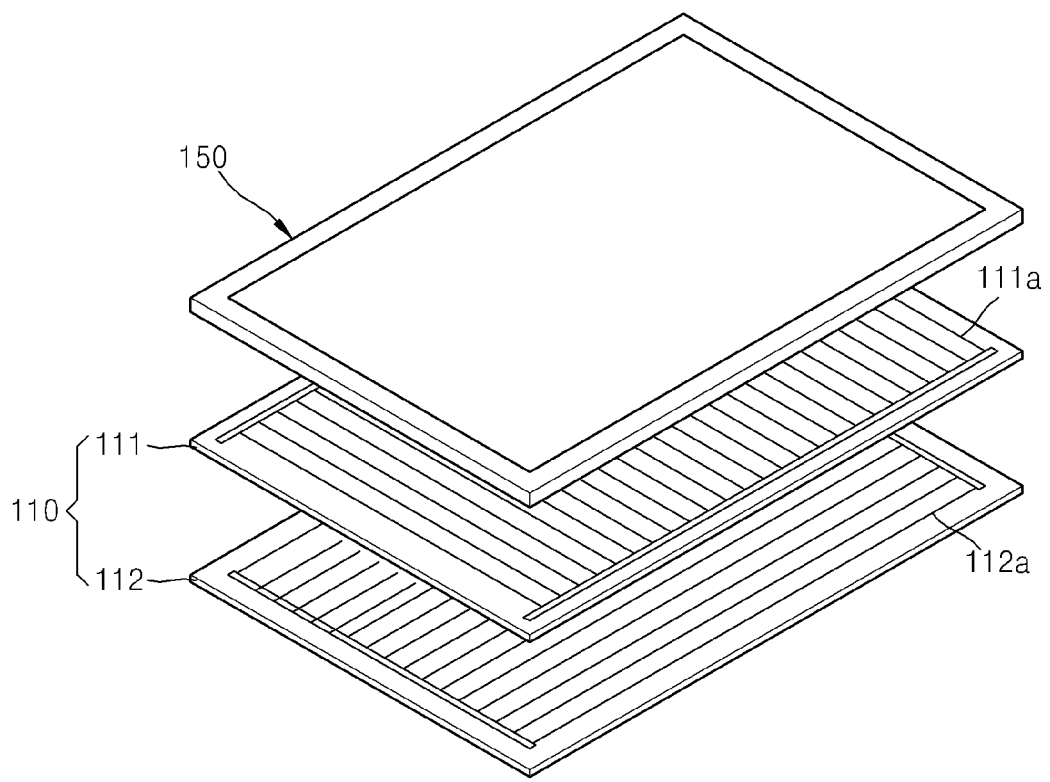
Figure 2:
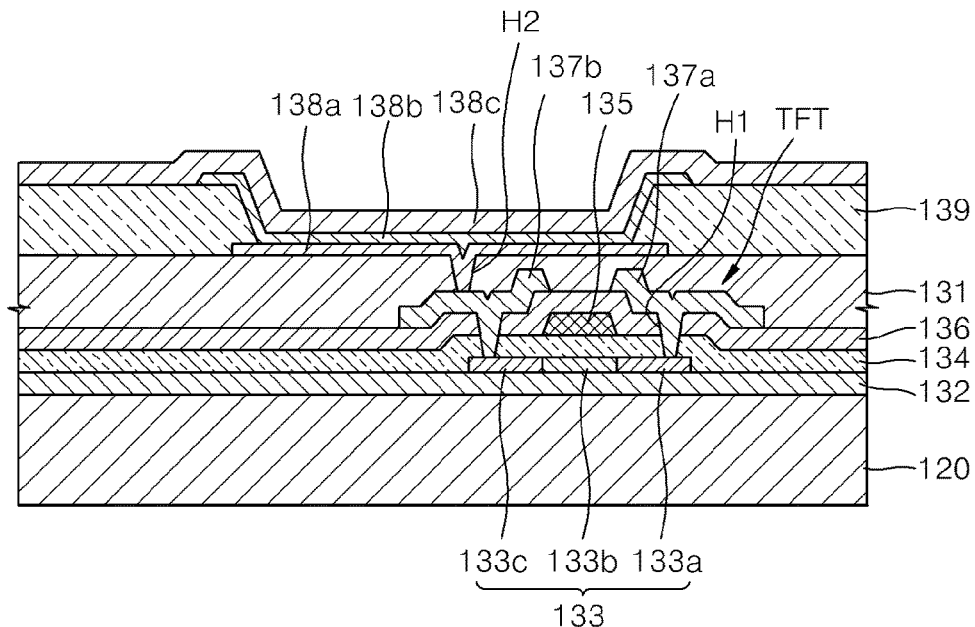
FIG. 2 is a cross-sectional view illustrating a display panel of FIG. 1.

FIG. 1 is a view illustrating a display device 100 according to an embodiment of the present invention. FIG. 2 is a cross-sectional view illustrating a display panel 150 of FIG. 1.

Referring to FIGS. 1 and 2, the display device 100 includes a digitizer 110 and the display panel 150. The digitizer 110 may be formed so that at least a part thereof is bent. In particular, two sides of the digitizer 110 may be bent.

The digitizer 110 includes a first digitizer 111 at which first lines 111a are formed. The digitizer 110 also includes a second digitizer 112 at which second lines 112a are formed to intersect with the first lines 111a, at a predetermined angle. The first lines 111a of the first digitizer 111 intersect with the second lines 112a of the second digitizer 112 to form coordinates in order to transmit a coordinate of a signal of an external device (not shown) to the outside, or in order to generate a signal.

The display device 100 includes an adhesive layer 160 which is disposed on the digitizer 110 and on the display panel 150 to adhere the digitizer 110 and the display panel 150 to each other. The adhesive layer 160 may be formed of polyethylene terephthalate (PET). The adhesive layer 160 may be used, or it may not be used. However, for the convenience of description, the adhesive layer 160 is used herein.

The display panel 150 includes a substrate 120, a display unit 130, and an encapsulating part 140. The substrate 120 may be a flexible substrate and may be formed of plastic having high heat resistance and durability such as polyimide, PET, polycarbonate, polyethylene naphthalate, polyarylate (PAR), polyetherimide, or the like. However, the present invention is not limited thereto, and the substrate 120 may be formed of various types of materials such as metal, glass, etc.

The encapsulating part 140 may be formed in a thin film encapsulation shape. In addition, the encapsulating part 140 may include a second substrate (not shown). In this case, the first substrate and the second substrate may be formed similarly. However, for the convenience of description, the encapsulating part 140 is formed in the thin film encapsulation shape herein.

The display unit 130 includes a thin film transistor (TFT) and a pixel part. The pixel part may be an organic light-emitting device (OLED). A method of forming the display unit 130 will now be described in detail with reference to FIG. 2.

A buffer layer 132 is formed of an organic compound and/or an inorganic compound on an upper surface of the substrate 120. The buffer layer 132 may be formed of SiOx (x≥1) or SiNx (x≥1). The buffer layer 132 may include an organic material, such as silicon oxide, silicon nitride, silicon oxynitride, aluminum oxide, aluminum nitride, titanium oxide, titanium nitride, or the like, or an organic material such as polyimide, polyester, acryl, or the like and may be formed of a stack of a plurality of the exemplified materials.

An active layer 133 is formed in a predetermined pattern on the buffer layer 132 and is buried by a gate insulating layer 134. The active layer 133 includes a source area 133a, a drain area 133c, and a channel area 133b interposed between the source and drain areas 133a and 133c.

In order to form the active layer 133, an amorphous silicon layer is formed on the buffer layer 132 and then crystallized to form a polycrystalline layer, and the polycrystalline layer is patterned. The source and the drain areas 133a and 133c of the active layer 133 are doped with a dopant according to types of TFTs such as a driving TFT (not shown), a switching TFT (not shown), etc.

A gate electrode 135 facing the active layer 133 and an interlayer insulating layer 136 burying the gate electrode 135 are formed on an upper surface of the gate insulating layer 134. The gate electrode 135 may include Au, Ag, Cu, Ni, Pt, Pd, Al, or Mo, or an alloy such as an alloy of Al and Nd or an alloy of Mo and W, but it is not limited thereto. The gate electrode 135 may be formed of various types of materials in consideration of design conditions. Also, the gate insulating layer 134 is disposed between the gate electrode 135 and the source and drain areas 133a and 133c to insulate the gate electrode 135 from the source and drain areas 133a and 133c. The gate insulating layer 134 may be formed of an inorganic material such as SiNx, SiO2, or the like.

Contact holes are formed in the interlayer insulating layer 136 and the gate insulating layer 134, and then source and drain electrodes 137a and 137b are formed on the interlayer insulating layer 136 to respectively contact the source and drain areas 133a and 133c.

A passivation layer 131 is formed on the TFT formed as described above, and a pixel electrode 138a of an OLED is formed on the passivation layer 131. The pixel electrode 138a contacts the drain electrode 137b of the TFT through a via hole H2 formed in the passivation layer 131. The passivation layer 131 may be formed of an inorganic material and/or an organic material as a single or dual layer. The passivation layer 131 may be formed as a planar layer so that an upper surface thereof is flat regardless of bending of a lower layer. Alternatively, the passivation layer 131 may be formed to bend with the bending of a lower layer. The passivation layer 131 may include SiO2, SiNx, SiON, Al2O3, TiO2, Ta2O5, HfO2, ZrO2, BST, or PZT as the inorganic material or may include commercial polymer such as polymethyl methacrylate (PMMA), polystyrene (PS), or the like, a polymer derivative having a phenol-based group, acrylic polymer, imide-based polymer, arylester-based polymer, amide-based polymer, fluorinated polymer, p-xylene polymer, vinyl alcohol polymer, blends thereof, or the like as the organic material. The passivation layer 131 may be formed of a transparent insulating material to achieve a resonance effect.

After the pixel electrode 138a is formed on the passivation layer 131, a pixel-defining layer (PDL) 139 is formed of an organic material and/or an inorganic material to cover the pixel electrode 138a, and an opening is formed in the passivation layer 131 to expose the pixel electrode 138a. The pixel electrode 138a may be a reflective electrode and may include a reflective layer formed of Ag, Mg, Al, Pt, Pd, Au, Ni, Nd, Ir, Cr, or a compound thereof and a transparent or semi-transparent electrode layer formed on the reflective layer. The transparent or semi-transparent electrode layer may include at least one of indium tin oxide (ITO), indium zinc oxide (IZO), zinc oxide (ZnO), indium oxide (In2O3), indium gallium oxide (IGO), and aluminum zinc oxide (AZO).

An organic emission layer 138b and a counter electrode 138c are formed on the pixel electrode 138a. The counter electrode 138c may be a transparent, or semi-transparent electrode, and it may be formed as a metallic thin film which includes Li, Ca, LiF/Ca, LiF/Al, Al, Ag, Mg, or a compound thereof and which has a low work function. An auxiliary electrode layer or a bus electrode may be further formed of a transparent electrode forming material, such as ITO, IZO, ZnO, or $In_2O_3$, on the metallic thin film.

The pixel electrode 138a operates as an anode electrode, and the counter electrode 138c operates a cathode electrode; however, polarities of the pixel electrode 138a and the counter electrode 138c may be opposite thereto. The pixel electrode 138a and the counter electrode 138c are insulated from each other by the organic emission layer 138b, and voltages having different polarities are applied to the organic emission layer 138b to emit light from the organic emission layer 138b.

The display panel 150 according to one embodiment is not limited to a top emission type, and may be a bottom emission type in which the light emitted from the organic emission layer 138b is discharged toward the substrate 120. In this case, the pixel electrode 138a may be a transparent or semi-transparent electrode, and the counter electrode 138c may be a reflective electrode. The display panel 150 may be a dual emission type in which light is emitted toward both a front side and a back side. However, for the convenience of description, the display panel 150 will be described as a top emission type herein.

The organic emission layer 138b may be a low or high molecular organic layer. If the organic emission layer 138b is a low molecular organic layer, a hole injection layer (HIL), a hole transport layer (HTL), an emission layer (EML), an electron transport layer (ETL), an electron injection layer (EIL) may be stacked as a single or multiple structure to form the organic emission layer 138b. Also, copper phthalocyanine (CuPc), N,N'-Di(naphthalene-1-yl)-N,N'-diphenyl-benzidine (NPB), tris-8-hydroxyquinoline aluminum (Alq3), or the like may be used as an organic material. These low molecular organic layers are formed according to a vacuum evaporation method. The HIL, the HTL, the ETL, and the EIL may be applied as common layers to red (R), green (G), and blue (B) pixels. Therefore, differently from shown in FIG. 2, these common layers may be formed to cover all pixels, like the counter electrode 138c.

If the organic emission layer 138b is a high molecular organic layer, the organic emission layer 138b may mainly include an HTL and an EML. The HTL may be formed of PEDOT, and the EML may be formed of a high molecular organic material such as Poly-Phenylenevinylene (PPV), polyfluorene, or the like. Also, the HTL and the EML may be formed according to a screen printing method, an inkjet printing method, or the like.

The organic emission layer 138b as described above is not limited thereto and may be applied to various embodiments.

The encapsulating part 140 may be formed in the thin film encapsulation shape as described above. In detail, one or more organic layers and one or more inorganic layers may be alternately stacked to form the encapsulating part 140. In particular, a plurality of inorganic layers or a plurality of organic layers may be stacked.

The organic layer may be formed of polymer and may be a single layer or a multi-layer formed of one of polyethylene terephthalate, polyimide, polycarbonate, epoxy, polyethylene, and polyacrylate. The organic layer may be formed of polyacrylate, in detail, may include a polymerized monomer composite including diacrylate monomer and triacrylate monomer. The polymerized monomer composite may further include monoacrylate monomer. The polymerized monomer composite may further include a well-known photo initiator such as TPO but it is not limited thereto.

The inorganic layer may be a single layer or a stack layer including metal oxide or metal nitride. In detail, the inorganic layer may include one of SiNx, $Al_2O_3$, $SiO_2$, and $TiO_2$.

An uppermost layer of the encapsulating part 140 that is exposed to the outside may be formed as an inorganic layer to prevent moisture from permeating into the OLED.

The encapsulating part 140 may include at least one sandwich structure in which at least one organic layer is inserted into at least two inorganic layers.

The encapsulating part 140 may include a first inorganic layer, a first organic layer, and a second inorganic layer sequentially from an upper part of the display unit 130. The encapsulating part 140 may include a first inorganic layer, a first organic layer, a second inorganic layer, a second organic layer, and a third inorganic layer sequentially from the upper part of the display unit 130. The encapsulating part 140 may include a first inorganic layer, a first organic layer, a second inorganic layer, a second organic layer, a third inorganic layer, a third organic layer, and a fourth inorganic layer.

A halogenated metal layer including LiF may be further included between the display unit 130 and the first inorganic layer. The halogenated metallic layer may prevent damage to the display unit 130 when the first inorganic layer is formed according to a sputtering method or a plasma deposition method.

The first organic layer may have a narrower area than the second inorganic layer, and the second organic layer may have a narrower area than the third inorganic layer. The first organic layer may be fully covered with the second inorganic layer, and the second organic layer may be fully covered with the third inorganic layer.

Figure 3A:
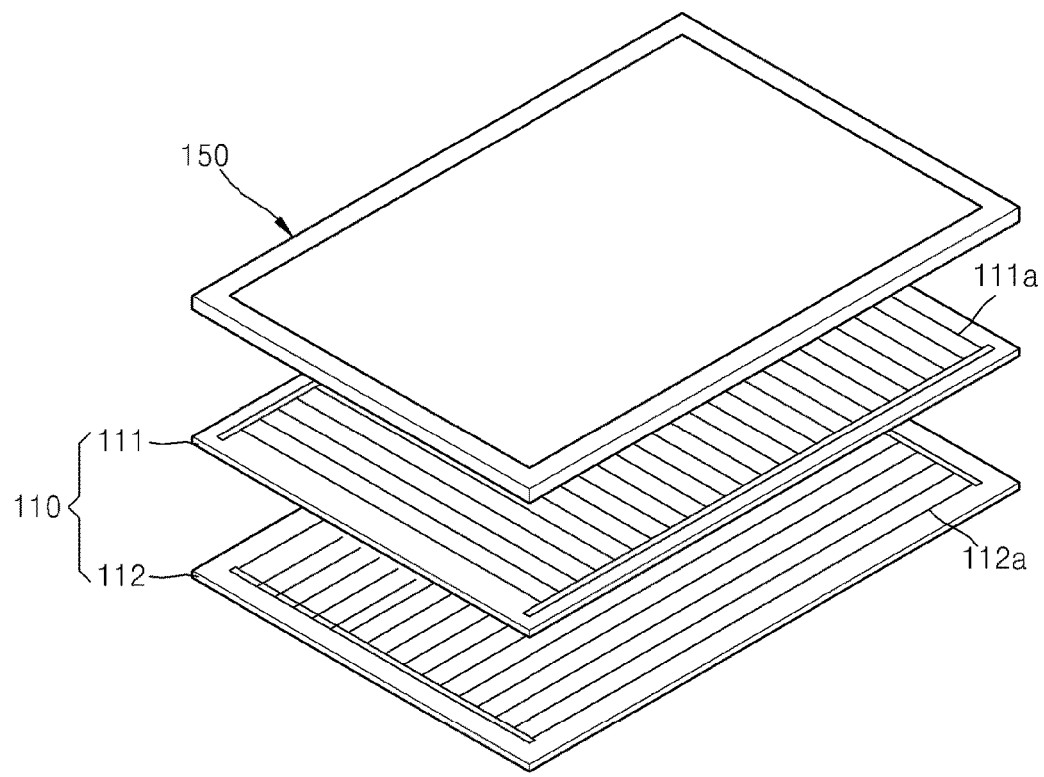
FIGS. 3A through 3C are views illustrating a method of manufacturing the display device of FIG. 1, according to an embodiment of the present invention.
Figure 3B:
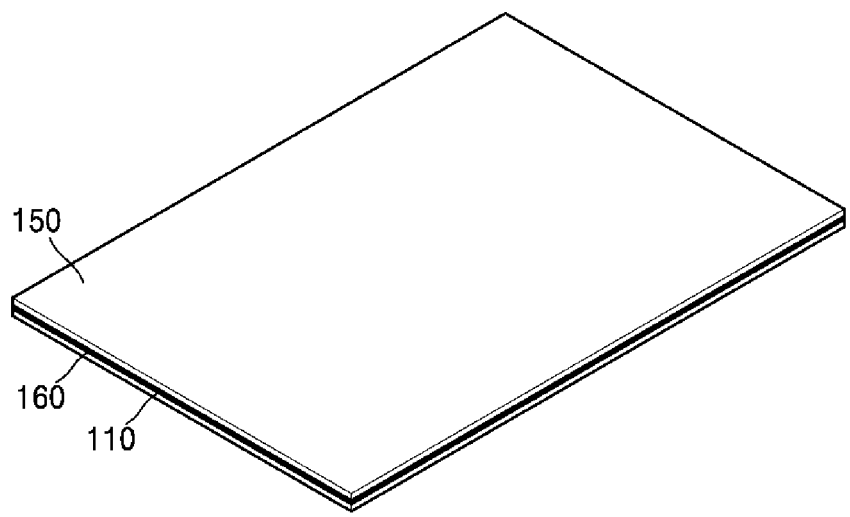
Figure 3C:
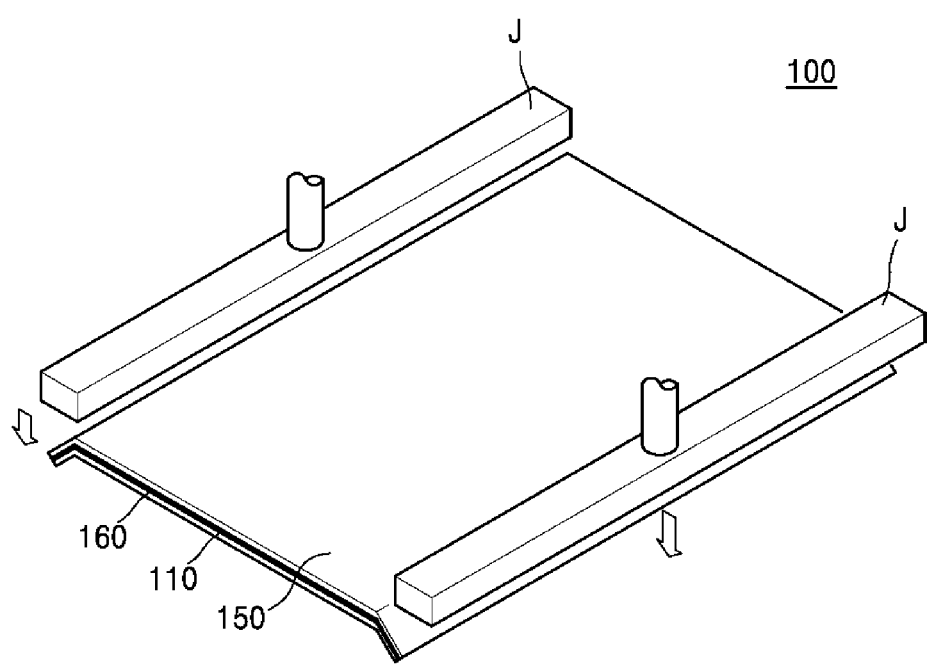
Figure 4A:
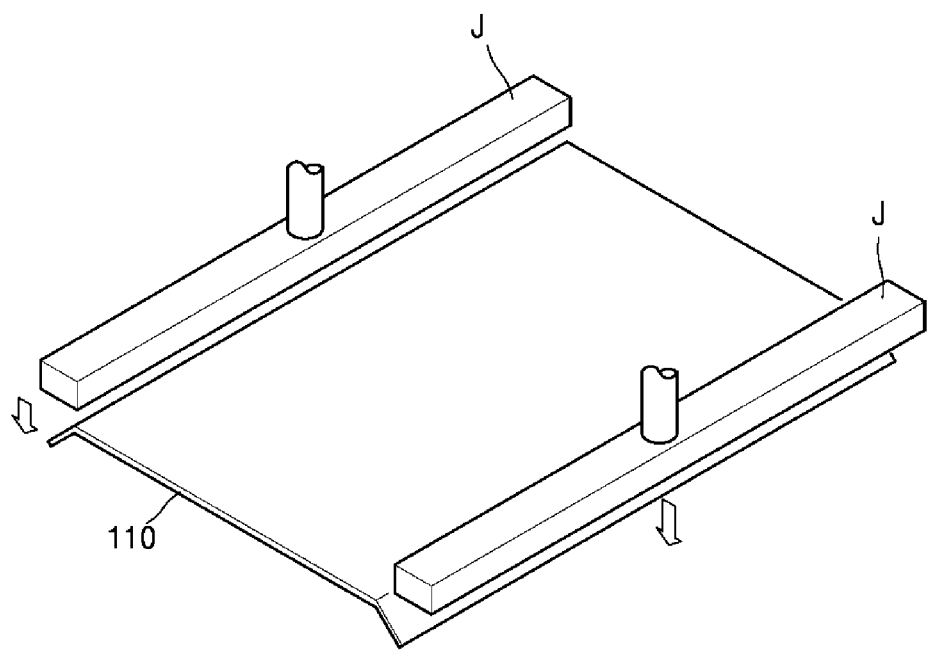
FIGS. 4A through 4C are views illustrating a method of manufacturing the display device of FIG. 1, according to another embodiment of the present invention.
Figure 4B:
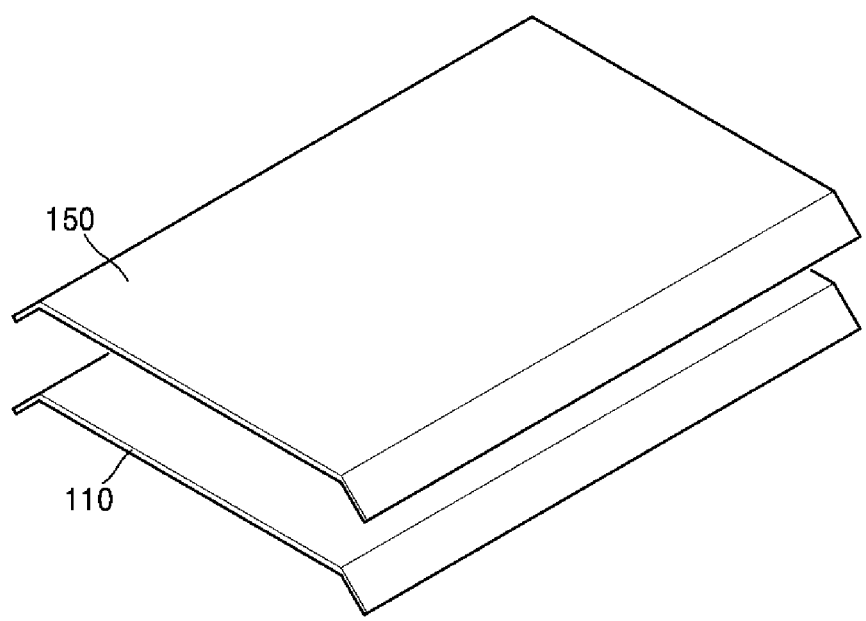
Figure 4C:
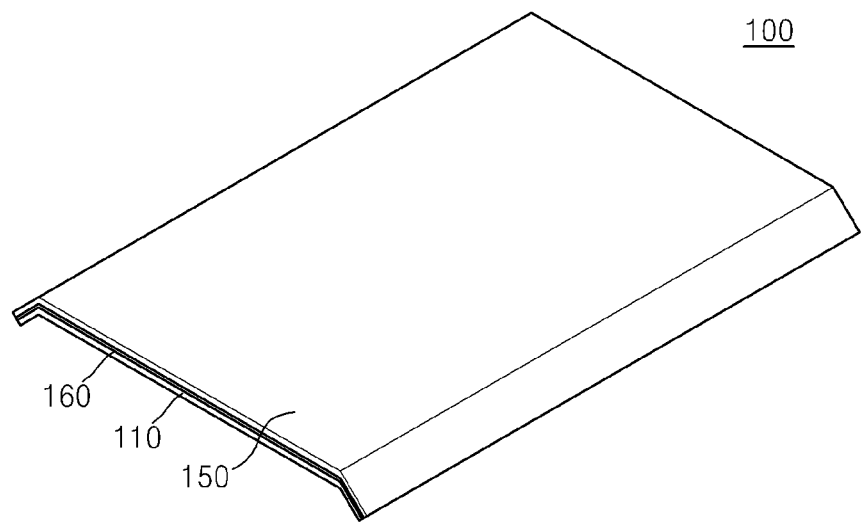

FIGS. 3A through 3C are views illustrating a method of manufacturing the display device 100 of FIG. 1, according to one embodiment of the present invention. FIGS. 4A through 4C are views illustrating a method of manufacturing the display device 100 of FIG. 1, according to an embodiment of the present invention.

Referring to FIGS. 3A through 3C, the method of manufacturing the display device 100 may include two types of methods that will be described in detail as follows.

According to one of the two types of methods, the display panel 150 is manufactured and provided as described above. The digitizer 110 is also manufactured and provided. In detail, the digitizer 110 may be formed in various forms. For example, the digitizer 110 may be formed in a flexible metal layer form of an electromagnetic induction type. As described above, the first and second digitizers 111 and 112 are adhered or connected to each other to manufacture the digitizer 110.

In particular, if the first and second digitizers 111 and 112 are formed as described above, the first lines 111a and the second lines 112a may be formed. The first lines 111a and the second lines 112a may be formed according to a general printed circuit technology (refer to FIG. 3A).

If the display panel 150 and the digitizer 110 are completely provided as described above, the display panel 150 and the digitizer 110 may be adhered to each other. The adhesive layer 160 may be coated or formed on at least one of the display panel 150 and the digitizer 110, and then the display panel 150 and the digitizer 110 may be adhered to each other (refer to FIG. 3B).

After the display panel 150 and the digitizer 110 are adhered to each other as described above, the display panel 150 and the digitizer 110 are bent by a jig (J) (not shown). If the jig J applies a force to the display panel 150 and the digitizer 110, a metal layer of the digitizer 110 may be plastically deformed.

At least a part of the digitizer 110 may be bent through the above-mentioned plastic deformation. The display panel 150 adhered to the digitizer 110 may be bent together with a shape deformation of the digitizer 110. In particular, the digitizer 110 is plastically deformed as described above and thus keeps its bent state without returning to its original state. Also, the display panel 150 keeps being adhered to the digitizer 110 and thus may be bent to correspond to a shape of the digitizer 110 (refer to FIG. 3C).

Therefore, the display device 100 keeps the bent state of the display panel 150 without using an additional part for the bent part of the display panel 150. In particular, the display device 100 plastically deforms the digitizer 110 to bend the digitizer 110 in order to bend the display panel 150 simultaneously with the digitizer 110. Therefore, a manufacturing time and a manufacturing process are simplified.

The other one of the two types of methods will now be described with reference to FIGS. 4A through 4C. As described above, the display panel 150 and the digitizer 110 are manufactured and provided. Also, the digitizer 110 is manufactured, and then at least a part of the digitizer 110 is bent and provided through the jig J (refer to FIG. 4A). In particular, in the above-described case, the display panel 150 and the digitizer 110 are provided without being adhered to each other.

The digitizer 110 may be bent through the jig J as described above. The metal layer of the digitizer 110 is plastically deformed as described above so that the digitizer 110 keeps a bent state thereof.

If the digitizer 110 is provided as described above, the adhesive layer 160 is coated or coated on at least one of the display panel 150 and the digitizer 110 to adhere the display panel 150 and the digitizer 110 to each other (refer to FIG. 4B).

As described above, the display panel 150 is flexibly formed and thus is bent according to the shape of the digitizer 110 to be adhered to the digitizer 110 (refer to FIG. 4C).

Therefore, after the display panel 150 adheres to the digitizer 110 in the display device 100, the display device 100 keeps the bent state of the display panel 150 through the digitizer 110. Also, the digitizer 110 in the display device 100 is formed in various shapes to adhere the display panel 150 to the digitizer 110 in order to realize a display panel in various shapes.

Figure 5:
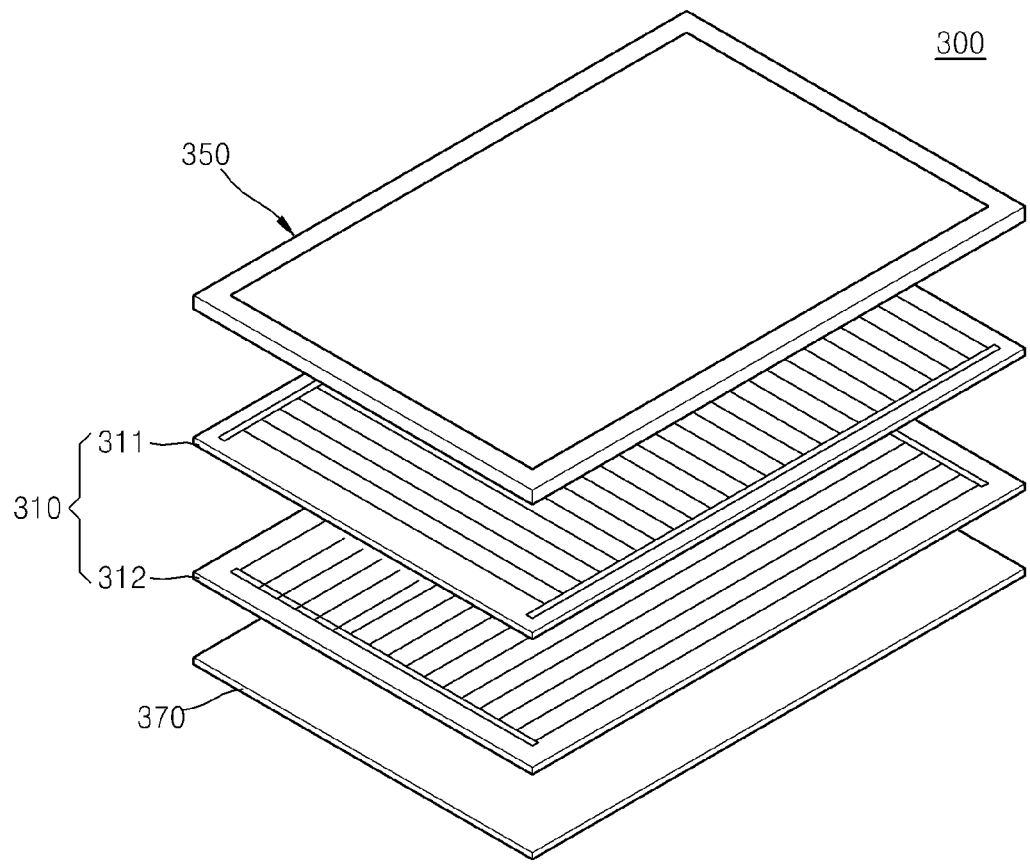
FIG. 5 is a view illustrating a display device according to another embodiment of the present invention.

FIG. 5 is a view illustrating a display device 300 according to another embodiment of the present invention.

Referring to FIG. 5, the display device 300 includes a display panel 350, a digitizer 310, an adhesive layer (not shown), an electromagnetic interface (EMI) shielding layer 370. The display panel 350, the digitizer 310, and the adhesive layer are substantially the same as the display panel 150, the digitizer 110, and the adhesive layer 160 described above, respectively, and thus their detailed descriptions are omitted herein.

The EMI shielding layer 370 may be formed of various types of materials. For example, the EMI shielding layer 370 may include various types of materials such as copper (Cu), nickel (Ni), ferrite, etc. The EMI shielding layer 370 is not limited thereto and thus may include all types of materials which shield against electromagnetic waves.

A method of manufacturing the display device 300 formed as described above may be classified into two types as described above with reference to FIG. 3. According to one of the two types of methods, the display panel 350, the digitizer 310, and the EMI shielding layer 370 are manufactured and provided. As described above, first and second digitizers 311 and 312 are adhered to each other to form the digitizer 310, and the EMI shielding layer 370 is adhered to the digitizer 310.

If the above-described process is completed, the adhesive layer is coated or formed on at least one of the digitizer 310 and the display panel 350, and then the digitizer 310 and the display panel 350 are adhered to each other. The display panel 350 and the EMI shielding layer 370 are respectively adhered onto opposite sides of the digitizer 310.

When the display panel 350 and the digitizer 310 are adhered to each other as described above, the display panel 350 and the digitizer 310 are bent through a jig J. The display panel 350, the digitizer 310, and the EMI shielding layer 370 are bent together.

When the display panel 350, the digitizer 310, and the EMI shielding layer 370 are bent as described above, the digitizer 310 is bent as described above to be plastically deformed. The EMI shielding layer 370 is formed of a metallic material and is bent to be plastically deformed together with the digitizer 310.

As described above, the digitizer 310 and the EMI shielding layer 370 are bent to be plastically deformed and thus keep their bent states. The display panel 350 keeps a bent state thereof together with the digitizer 310 and the EMI shielding layer 370.

Therefore, the display device 300 keeps the display panel 350 in a bent state without an additional structure. Also, the display device 300 bends the EMI shielding layer 370 together with the digitizer 310 to effectively keep the bent state of the display panel 350.

According to the other one of the two types of methods, the display panel 350, the digitizer 310, and the EMI shielding layer 370 are manufactured and provided as described above. The digitizer 310 and the EMI shielding layer 370 are adhered to each other.

If the above-described process is completed, at least a part of the digitizer 310 is bent through a jig J. The EMI shielding layer 370 is also bent when the digitizer 310 is bent.

As described above, the digitizer 310 and the EMI shielding layer 370 are bent to be plastically deformed. In particular, the digitizer 310 and the EMI shielding layer 370 keep their bent states through the plastic deformation.

When the digitizer 310 and the EMI shielding layer 370 are completely bent as described above, the adhesive layer is coated or formed on at least one of the digitizer 310 and the display panel 350. The digitizer 310 and the display panel 350 are compressed against each other to be adhered to each other.

In particular, if the display panel 350 is adhered to the digitizer 310 as described above, the display panel 350 is adhered to the digitizer 310 along an outer surface of the digitizer 310. At least a part of the display panel 350 is bent together with the digitizer 310 so that the display panel 350 is adhered to the digitizer 310.

Therefore, the display device 300 keeps the bent state of the display panel 150 without using an additional part for the bent part of the display panel 150. In particular, the display device 300 plastically deforms and bends the digitizer 310 to bend the display panel 150 simultaneously with the digitizer 310, thereby simplifying a manufacturing time and a manufacturing process.

Figure 6:
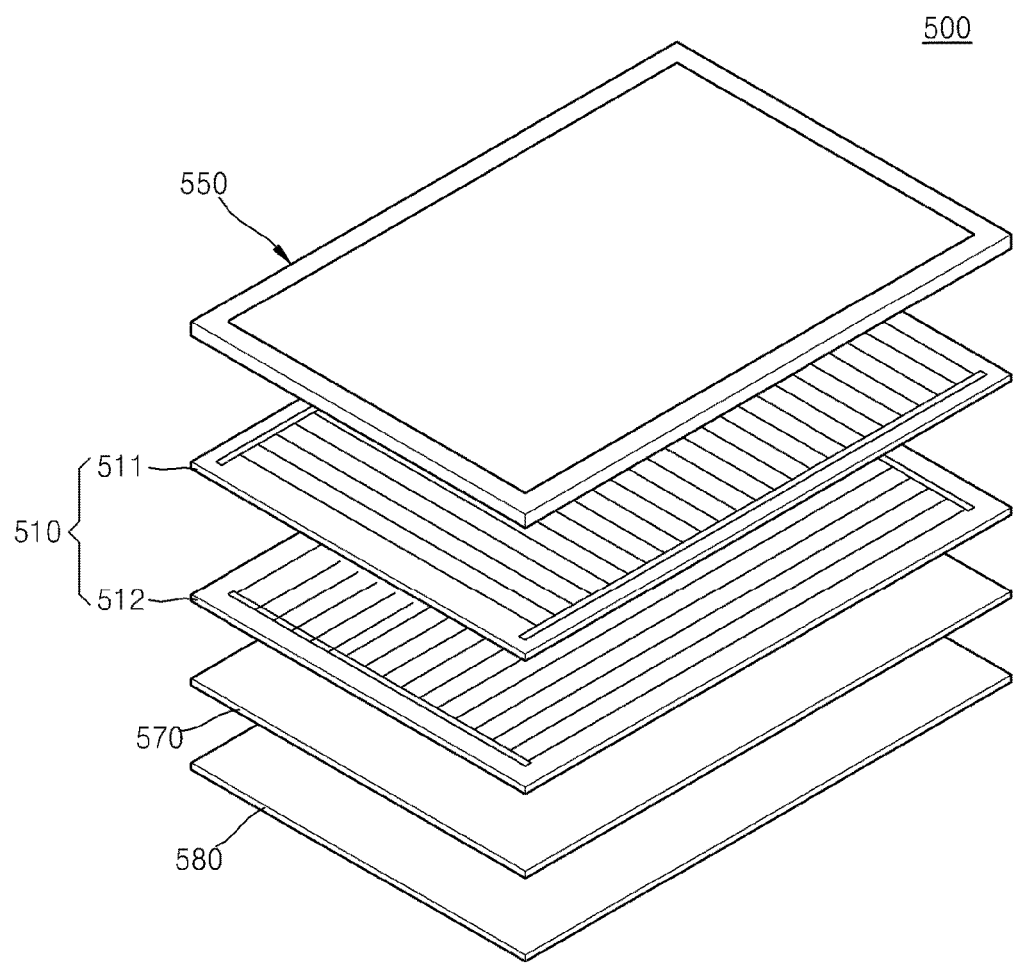
FIG. 6 is a view illustrating a display device according to another embodiment of the present invention.

FIG. 6 is a view illustrating a display device 500 according to another embodiment of the present invention.

Referring to FIG. 6, the display device 500 includes a display panel 550, an adhesive layer (not shown), a digitizer 510, an EMI shielding layer 570, and a flexible printed circuit (FPC) 580. The display panel 550, the adhesive layer, the digitizer 510, and the EMI shielding layer 570 are substantially the same as those described in the previous exemplary embodiments, and thus their detailed descriptions are omitted herein.

The FPC 580 may be formed to be substantially the same or similar to a general FPC. The FPC 580 is electrically connected to the digitizer 510 to transmit a signal generated by the digitizer 510 to the outside.

A method of manufacturing the display device 500 as described above may be similar to the above-described methods. In detail, according to one of methods of manufacturing a display device, the display panel 550, the digitizer 510, and the EMI shielding layer 570 are manufactured and provided as described above. The FPC 580 is manufactured and provided together with the display panel 550, the digitizer 510, and the EMI shielding layer 570. First and second digitizers 511 and 512 are adhered to each other as described above to manufacture the digitizer 510.

If the preparation is completed as described above, the display panel 550 and the digitizer 510 are adhered to each other through the adhesive layer, and the EMI shielding layer 570 and the FPC 580 are sequentially adhered to the digitizer 510. If the adhesion is completed as described above, the display panel 550, the digitizer 510, the EMI shielding layer 570, and the FPC 580 are sequentially stacked.

If the above-described process is completed, a force is applied to the display device 500 to bend at least a part of the display device 500 through a jig J. The digitizer 510, the EMI shielding layer 570, and the FPC 580 are bent by the jig J. In particular, metallic materials of the digitizer 510, the EMI shielding layer 570, and the FPC 580 may be plastically deformed when being bent.

If the plastic deformation occurs as described above, the digitizer 510, the EMI shielding layer 570, and the FPC 580 do not return to their original states but keep their bent states. In particular, the display panel 550 keeps the bent state thereof together with the digitizer 510, the EMI shielding layer 570, and the FPC 580 due to the above-described deformation thereof.

Therefore, the display device 500 keeps the bent state of the display panel 550 without using an additional part for the bent part of the display panel 550. In particular, the display device 500 plastically deforms the digitizer 510 to bend the digitizer 510 in order to bend the display panel 550 simultaneously with the digitizer 510, thereby simplifying a manufacturing time and a manufacturing process.

According to one of the methods of manufacturing the display device 500, the display panel 550, the digitizer 510, the EMI shielding layer 570, and the FPC 580 are manufactured and provided as described above.

When the above-described process is completed, the digitizer 510, the EMI shielding layer 570, and the FPC 580 are adhered to one another, and then their parts are bent through the jig J. The digitizer 510, the EMI shielding layer 570, and the FPC 580 are bent to be plastically deformed. In particular, the digitizer 510, the EMI shielding layer 570, and the FPC 580 do not return to their original states but keep their bent states after being bent.

When the above-described process is completed, the adhesive layer is coated or formed on at least one of the display panel 550 and the digitizer 510, and then the display panel 550 and the digitizer 510 are adhered to each other to be fixed. The display panel 550 is adhered to an outer surface of the digitizer 510 and thus keeps the bent state thereof together with the digitizer 510.

Therefore, according to the display device 500 and the method of manufacturing the display device 500, an additional part is not used for the bent part of the display panel 550 in order to bend the display panel 550. In particular, the display device 500 plastically deforms the digitizer 510 to bend the digitizer 510 in order to bend the display panel 550 simultaneously with the digitizer 510, thereby simplifying a manufacturing time and a manufacturing process.

Also, according to the display device 500 and the method of manufacturing the display device 500, the bent state of the display panel 550 is effectively kept through the digitizer 510, the EMI shielding layer 570, and the FPC 580.

According to the embodiments of the present invention as described above, an additional part is not used for a bent part of a display panel to bend the display panel. In particular, a digitizer is plastically deformed to be bent in order to bend the display panel simultaneously with the digitizer, thereby simplifying a manufacturing time and a manufacturing process.

While the present invention has been particularly shown and described with reference to certain embodiments thereof, it will be understood by those of ordinary skill in the art that various changes in form and details may be made therein without departing from the spirit and scope of the present invention as defined by the following claims.

What is claimed is:

1. A method of manufacturing a display device, the method comprising:
    adhering a display panel to a digitizer, the digitizer formed of a flexible metal layer used for electromagnetic lamination, and comprising:
        a first digitizer on which first lines are formed; and
        a second digitizer on which second lines are formed, wherein the second lines are formed to cross the first lines; and thereafter
    simultaneously bending at least a part of the digitizer and at least part of the display panel through a jig,
    wherein when the jig applies a force to at least a part of the digitizer, a metal layer of the digitizer is plastically deformed to keep a bent state, and
    wherein the display panel remains in a bent state due to its adherence to, and the plastic deformation of, the digitizer.

2. The method of claim 1, further comprising adhering the display panel onto an outer surface of the digitizer to keep a bent state of the display panel.

3. The method of claim 2, further comprising adhering the display panel and the digitizer to each other through an adhesive layer.

4. The method of claim 1, further comprising adhering an electromagnetic interference (EMI) shielding layer to the digitizer before the at least a part of the digitizer is bent through the jig.

5. The method of claim 4 further comprising adhering a flexible printed circuit (FPC) to the EMI shielding layer.

6. The method of claim 1, wherein the display panel is flexible.

* * * * *